United States Patent
Kaida et al.

[11] Patent Number: 5,923,589
[45] Date of Patent: Jul. 13, 1999

[54] NON-VOLATILE SEMICONDUCTOR MEMORY DEVICE HAVING LONG-LIFE MEMORY CELLS AND DATA ERASING METHOD

[75] Inventors: Takayuki Kaida, Gifu-ken; Yukihiro Ohya, Saitama-ken, both of Japan

[73] Assignee: Sanyo Electric Co., Ltd., Osaka, Japan

[21] Appl. No.: 08/961,390

[22] Filed: Oct. 30, 1997

[30] Foreign Application Priority Data

Oct. 31, 1996 [JP] Japan ..................................... 8-290084

[51] Int. Cl.$^6$ .................................................. G11C 16/04
[52] U.S. Cl. ............................... 365/185.28; 365/185.18; 365/185.24; 365/185.29; 365/185.33
[58] Field of Search .......................... 365/185.28, 185.18, 365/185.33, 185.24, 185.29

[56] References Cited

U.S. PATENT DOCUMENTS

| 5,029,130 | 7/1991 | Yeh ......................................... 365/185 |
| 5,245,570 | 9/1993 | Fazio et al. .............................. 365/185 |
| 5,526,315 | 6/1996 | Kaya et al. .......................... 365/185.18 |
| 5,636,162 | 6/1997 | Coffman et al. ..................... 365/185.22 |
| 5,659,505 | 8/1997 | Kobayashi et al. ................. 365/185.29 |

FOREIGN PATENT DOCUMENTS

WO92/18980   10/1992   WIPO .

Primary Examiner—David Nelms
Assistant Examiner—Hien Nguyen
Attorney, Agent, or Firm—Sheridan Ross P.C.

[57] ABSTRACT

A non-volatile semiconductor memory device is provided that includes a split gate type memory cell and a control unit. The split gate type memory cell has a floating gate electrode and a control gate electrode. The control unit counts a number of data rewritings and controls the voltage applied to the control gate electrode so that the Fowler-Nordheim tunnel current increases to sufficiently pull out the charge stored in the floating gate electrode when the number of data writings exceeds a predetermined number. This extends the life of the memory device.

24 Claims, 16 Drawing Sheets

Fig.5

| Operation mode | Write | Erase | Read | Standby |
|---|---|---|---|---|
| Word line WLm (Control gate CG) | +1V | +14V | +5V | 0V |
| Bit line BLm (Drain D) | +12V | 0V | +2.5V | 0V |
| Common source line SL (Source S) | 0V | 0V | 0V | 0V |
| Substrate 102 | 0V | 0V | 0V | 0V |

Fig.6

| Operation mode | Write | Erase | Read | Standby |
|---|---|---|---|---|
| Word line WLm (Control gate CG) | +1V | +14V | +5V | 0V |
| Bit line BLm (Drain D) | 0V | 0V | +2.5V | 0V |
| Common source line SL (Source S) | +12V | 0V | 0V | 0V |
| Substrate 102 | 0V | 0V | 0V | 0V |

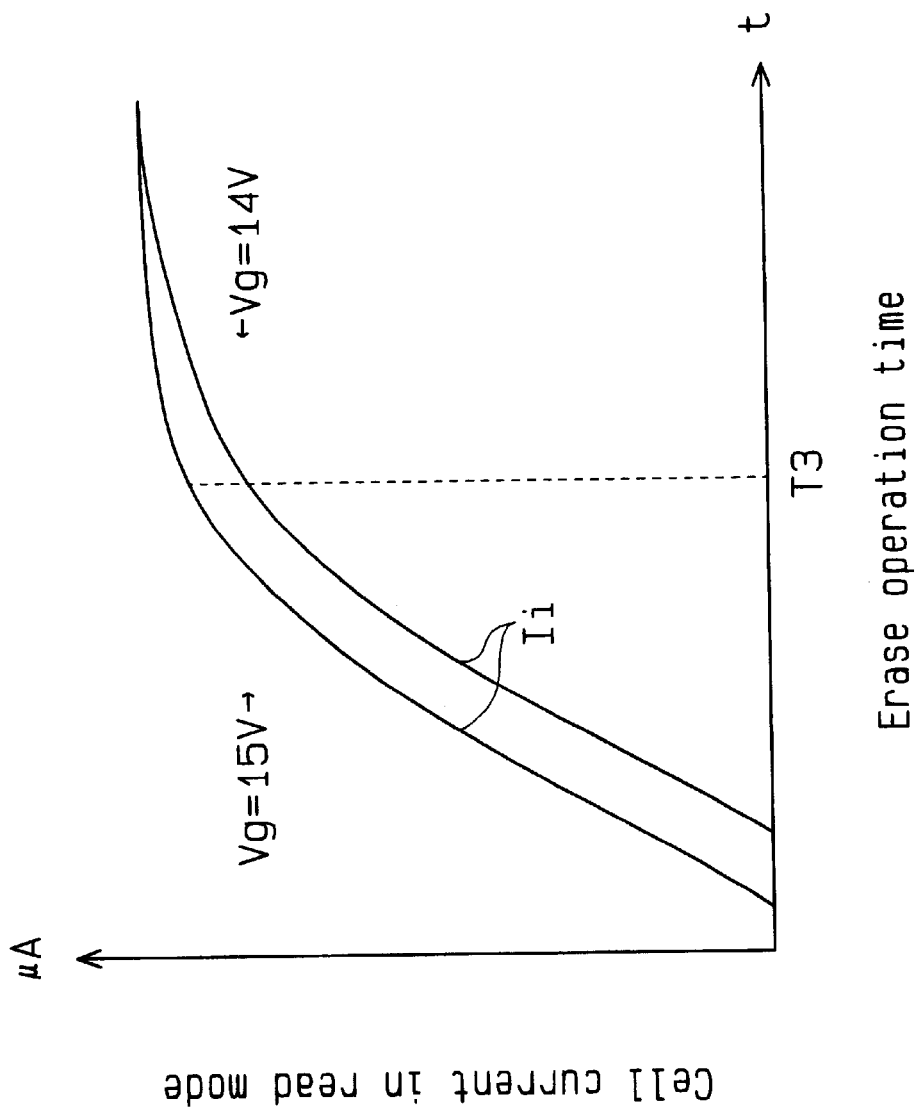

Fig.11

| Operation mode | Write | Erase | Read | Standby |
|---|---|---|---|---|
| Word line WLm (Control gate CG) | +12V | 0V | +5V | 0V |
| Common drain line DL (Drain D) | 0V | +12V | +5V | 0V |
| Bit line BLm (Source S) | +5V | OPEN | 0V | 0V |
| Substrate 202 | 0V | 0V | 0V | 0V |

NON-VOLATILE SEMICONDUCTOR MEMORY DEVICE HAVING LONG-LIFE MEMORY CELLS AND DATA ERASING METHOD

BACKGROUND OF THE INVENTION

1. Field of the Invention

The present invention relates to a non-volatile semiconductor memory device, and, more particularly, to a non-volatile semiconductor memory device that erases data stored in a memory cell using a Fowler-Nordheim (FN) tunnel current.

2. Description of the Related Art

A great deal of attention has been paid to non-volatile semiconductor memories, such as a Ferro-electric Random Access Memory, EPROM (Erasable and Programmable Read Only Memory) and EEPROM (Electrically Erasable and Programmable Read Only Memory). The EPROM and EEPROM have a plurality of memory cells each including a floating gate for storing a charge and a control gate for detecting a change in the threshold voltage in accordance with the quantity of charge stored in the floating gate. Therefore, data is stored using these types of memory cells. The EEPROM can erase data of the entire array of memory cells. The EEPROM includes a flash EEPROM, which has the memory cell array separated into a plurality of blocks and can thus selectively erase data block by block. The flash EEPROM has the following advantages:

(1) Non-volatile property for stored data,
(2) Low power consumption,
(3) Electrically rewritable (rewritable on board), and
(4) Low cost.

Therefore, this flash EEPROM is widely applicable as a memory for storing programs or data in electronic devices, such as portable telephones and portable information terminals. There are two types of flash EEPROMs at present: split gate type and stacked gate type.

U.S. Pat. No. 5,202,850 and International Patent Publication WO92/18980 disclose a split gate flash EEPROM. FIG. 1 is a schematic cross-sectional view of a split gate memory cell 102 provided in a split gate type flash EEPROM of U.S. Pat. No. 5,202,850. The split gate memory cell 201 has an N-type source S and N-type drain D, both defined on a P-type single crystalline silicon substrate 102, a floating gate FG provided on a first insulator film 103 over a channel CH between the source S and drain D, and a control gate CG located a second insulator film 104 over the floating gate FG. A part of the control gate CG is arranged as a select gate 105 on the channel CH via the first insulator film 103. International Patent Publication WO92/18980 discloses a flash EEPROM in which the source S of the split gate memory cell 101 is identified as a "drain" and the drain D is identified as a "source".

FIG. 2 is a schematic cross-sectional view showing a conventional stacked gate NOR type memory cell 201. The stacked gate memory cell 201 has a source S and a drain D, both having an N-type conductivity and defined on a single crystalline silicon substrate 202 having a P-type conductivity, a floating gate FG located on a first insulator film 203 over a channel CH between the source S and the drain D, and a control gate CG arranged on a second insulator film 204 over the floating gate FG. The floating gate FG and the control gate CG are stacked without deviation from each other. Therefore, the source S and the drain D are defined symmetrically to the gates FG and CG and the channel CH.

In the erase mode of the split gate memory cells in FIG. 1, electrons in the floating gate electrode FG are drained toward the control gate electrode CG as indicated by the arrow A, erasing data stored in the memory cell 101. In the erase mode of the stacked gate NOR type memory cells in FIG. 2, electrons in the floating gate electrode FG are drained toward the drain region D as indicated by the arrow B, erasing data stored in the memory cell 201. As the electrons pass the silicon oxide film 104 or 203, large stress is applied to the silicon oxide film 104 or 203. Therefore, repeated writing and erasure increase the stress that is applied to the silicon oxide film 104 or 203, thus forming an electron trap in the silicon oxide film 104 or 203. This electron trap interferes with the movement of the electrons to the control gate electrode CG or the drain region D from the floating gate electrode FG. As the number of writings and the number of erasures (i.e., the number of rewritings) increase, therefore, it becomes impossible to properly drain electrons from the floating gate electrode FG.

In the read mode of each memory cell 101 or 201, as shown in FIG. 3, the current (cell current) Iw, which flows into the memory cell 101 or 201 in a data written state, does not change with an increase in the number of data rewritings. On the contrary, the current (cell current) Ii, which flows into the memory cell 101 or 201 in a data erased state, decreases as the number of data rewritings increases in the read mode of each memory cell 101 or 201. As a result, the value of the cell current Ii approaches the value of the cell current Iw. When the cell current Ii drops further and becomes smaller than a predetermined cell current Ir1, it become impossible to determine from the cell current whether the memory cell 101 or 201 is in a written state or in an erased state. That is, data stored in the memory cell 101 or 201 cannot be read out. The predetermined cell current value Ir1 is determined by the characteristics of sense amplifiers in the flash EEPROM. This cell current value Ir1 represents the lower limit of the cell current Ii flowing in the memory cell 101 or 201 in the data erased state.

As apparent from the above, the operational life of the memory cells 101 or 201 is limited by the number of data rewritings. This means the operational life of the flash EEPROM provided with memory cell 101 or 201 is similarly limited.

SUMMARY OF THE INVENTION

The present invention relates to a non-volatile semiconductor memory having long-life memory cells. The present invention can be implemented in numerous ways, including as an apparatus and method.

In a first embodiment of the invention pertains to a data erasing method in a non-volatile semiconductor memory device capable of rewriting data. The non-volatile semiconductor memory device includes a split gate type memory cell having a semiconductor substrate, a floating gate electrode located over the semiconductor substrate, and a control gate electrode located over the floating gate electrode and the semiconductor substrate. The floating gate electrode stores a charge and is capacitively coupled to the control gate electrode. It is determined whether or not data is stored in the split gate type memory cell in accordance with the quantity of charge stored in the floating gate electrode. The data erasing method includes the steps of: (a) controlling the voltage applied to the control gate electrode so that data is erased by pulling out the charge stored in the floating gate electrode using a Fowler-Nordheim tunnel current, which flows from the control gate electrode to the floating gate electrode; (b) counting a number of data rewritings; and (c)

controlling the voltage applied to the control gate electrode so that the Fowler-Nordheim tunnel current increases to sufficiently pull out the charge stored in the floating gate electrode when the number of data writings exceeds a predetermined number.

In a second embodiment of the invention, the data erasing method includes the steps of: (a) controlling the voltage applied to the control gate electrode so that data is erased by pulling out the charge stored in the floating gate electrode using a Fowler-Nordheim tunnel current, which flows from the control gate electrode to the floating gate electrode; (b) determining whether or not data is erased; and (c) controlling the voltage applied to the control gate electrode so that the Fowler-Nordheim tunnel current increases to sufficiently pull out the charge stored in the floating gate electrode when data is not erased.

In a third embodiment of the invention pertains to a data erasing method in a non-volatile semiconductor memory device capable of rewriting data. The non-volatile semiconductor memory device includes a stacked gate type memory cell having a semiconductor substrate, a drain region defined on the semiconductor substrate, and a floating gate electrode located over the semiconductor substrate. The floating gate stores a charge and is capacitively coupled to the drain region. It is determined whether or not data is stored in the stacked gate type memory cell in accordance with the quantity of charge stored in the floating gate electrode. The data erasing method includes the steps of: (a) controlling the voltage applied to either the drain region or the semiconductor substrate so that data is erased by pulling out the charge stored in the floating gate electrode using a Fowler-Nordheim tunnel current, which flows from either the drain region or the semiconductor substrate to the floating gate electrode; (b) counting a number of data rewritings; and (c) controlling the voltage applied to either the drain region or the semiconductor substrate so that the Fowler-Nordheim tunnel current increases to sufficiently pull out the charge stored in the floating gate electrode when the number of data writings exceeds a predetermined number.

In a fourth embodiment of the invention, the data erasing method includes the steps of: (a) controlling the voltage applied to either the drain region or the semiconductor substrate so that data is erased by pulling out the charge stored in the floating gate electrode using a Fowler-Nordheim tunnel current, which flows from either the drain region or the semiconductor substrate to the floating gate electrode; (b) determining whether or not data is erased; and (c) controlling the voltage applied to either the drain region or the semiconductor substrate so that the Fowler-Nordheim tunnel current increases to sufficiently pull out the charge stored in the floating gate electrode when data is not erased.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a table showing voltage control in the individual operation modes of the flash EEPROM in FIG. 4;

FIG. 6 is a table showing another voltage control in the individual operation modes of the flash EEPROM in FIG. 4;

FIG. 8 is a graph showing the relationship between the current flowing in a memory cell in read mode and the erasing operation time;

FIG. 11 is a table showing voltage control in the individual operation modes of the flash EEPROM in FIG. 10;

DETAILED DESCRIPTION OF THE PREFERRED EMBODIMENTS

First Embodiment

Figure 1:
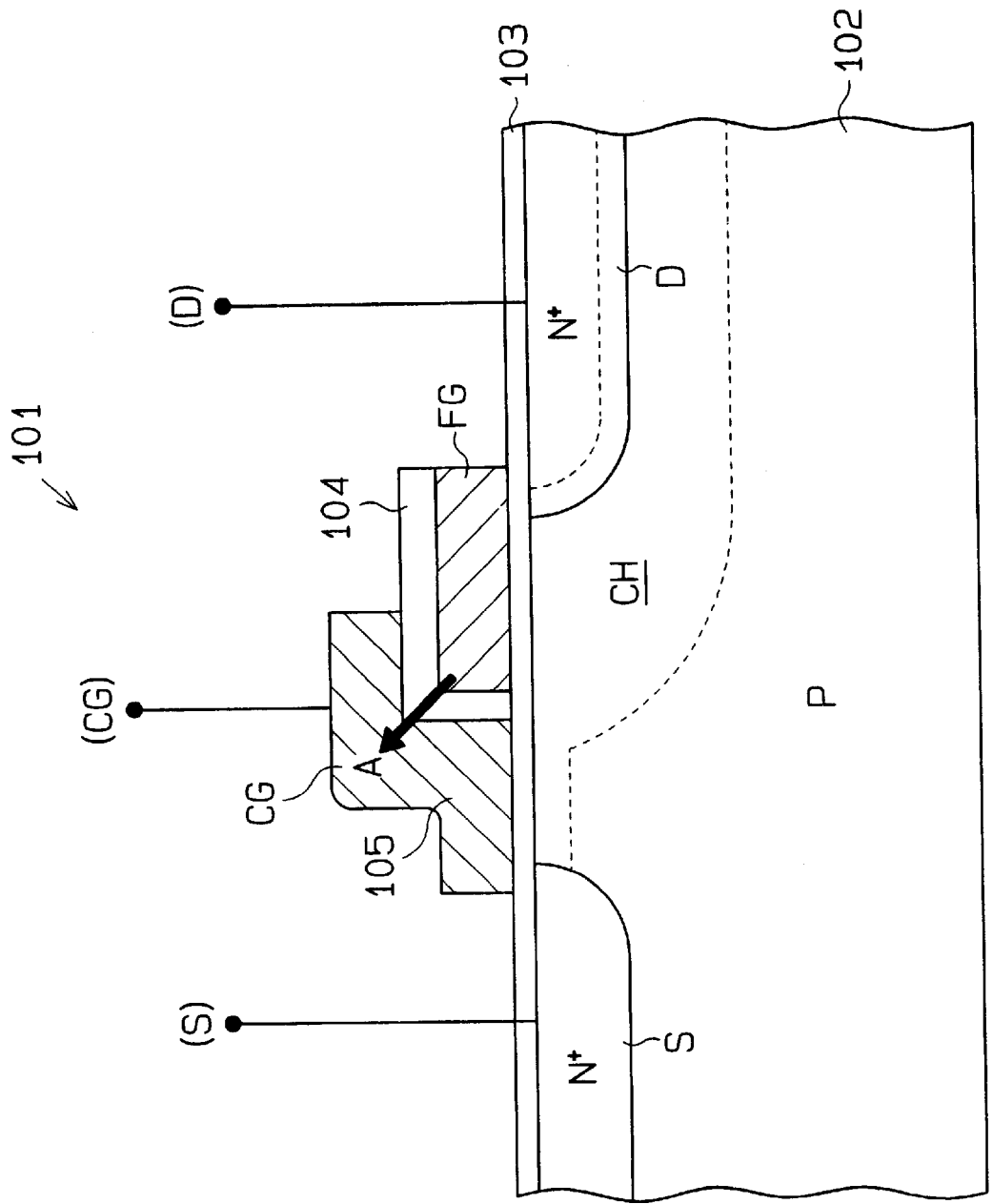
FIG. 1 is a schematic cross-sectional view of a split gate memory cell.
Figure 2:
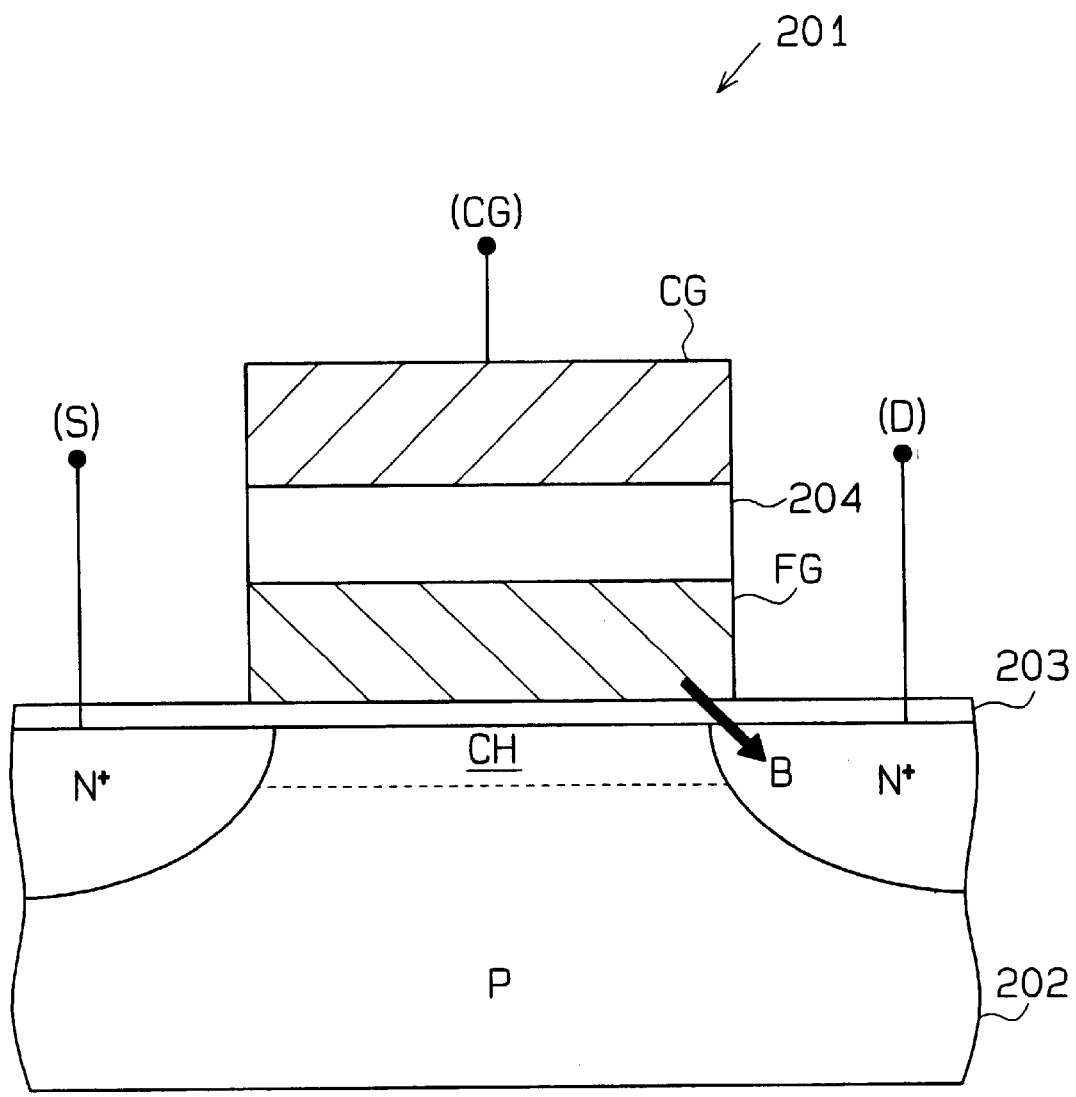
FIG. 2 is a schematic cross-sectional view of a stacked gate memory cell.
Figure 3:
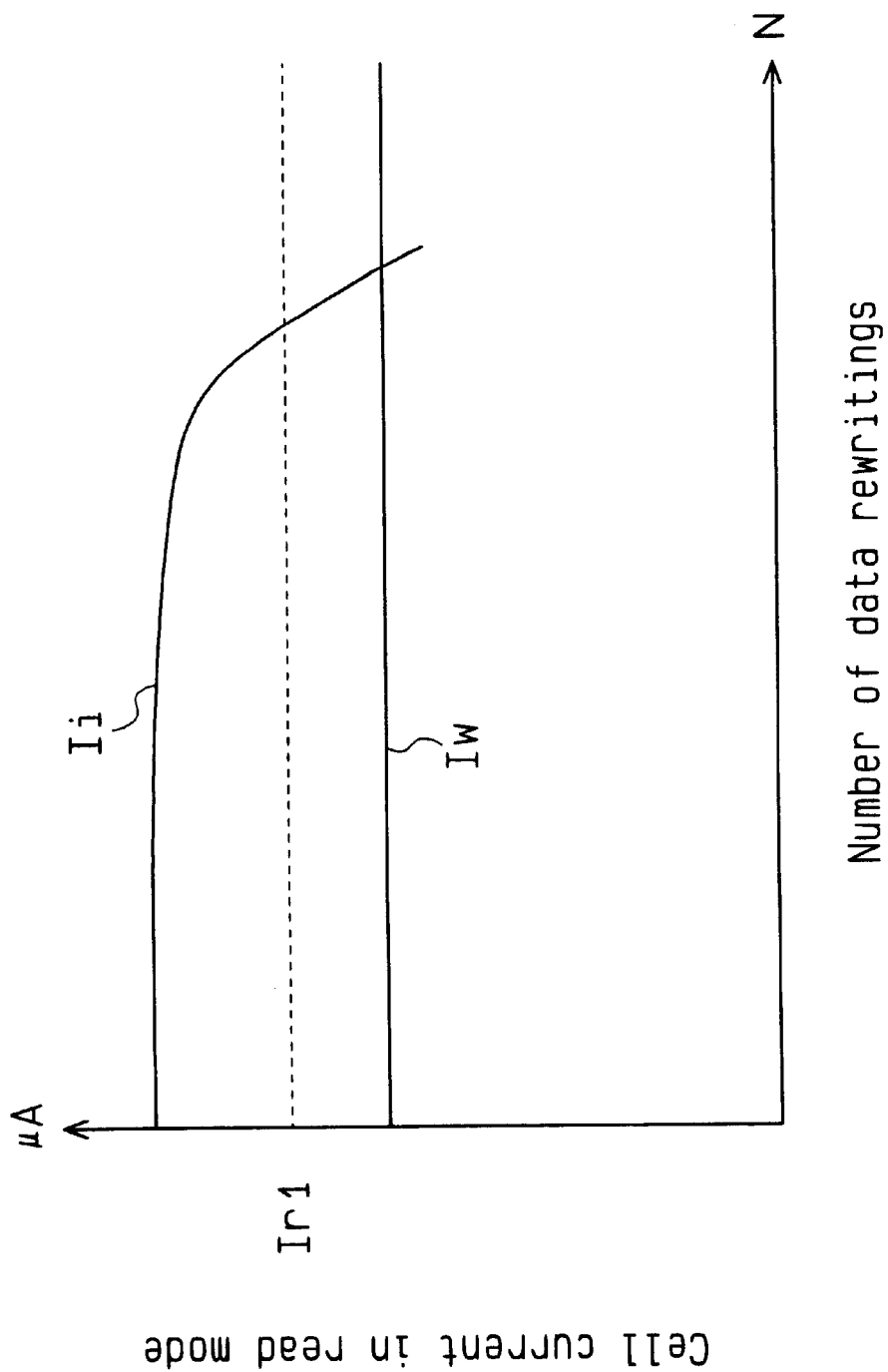
FIG. 3 is a graph showing the relationship between the current flowing in a memory cell in read mode and the number of data rewritings in the memory cell of the prior art.
Figure 4:
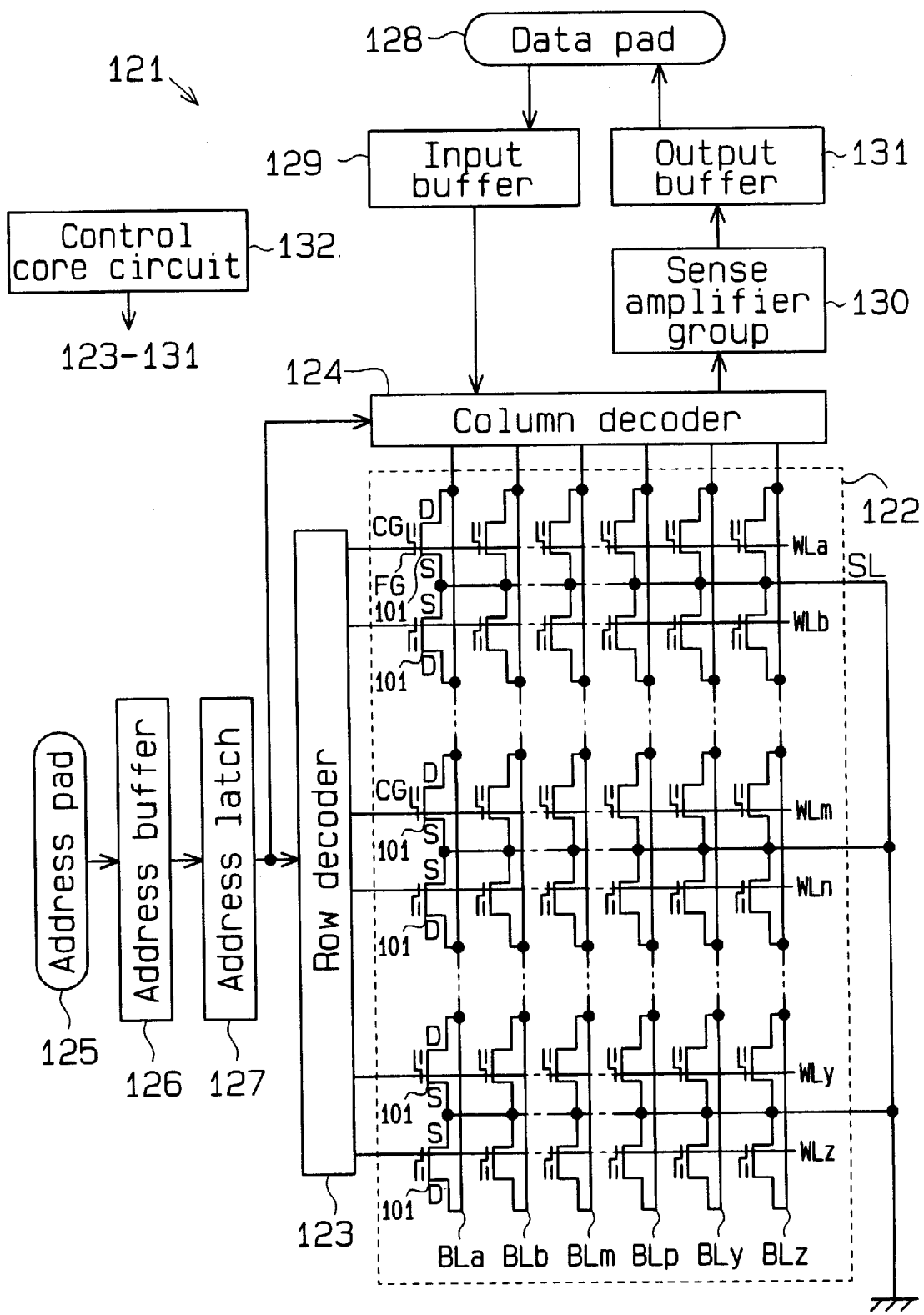
FIG. 4 is a block diagram of a flash EEPROM having split gate memory cells according to a first embodiment of the invention.

A flash EEPROM having split gate memory cells according to a first embodiment of the present invention will now be described with reference to the accompanying drawings. FIG. 4 is a block diagram showing a flash EEPROM 121 having split gate memory cells 101. The flash EEPROM 121 includes a memory cell array 122, a row decoder 123, a column decoder 124, an address pad 125, an address buffer 126, an address latch 127, a data pad 128, an input buffer 129, a sense amplifier group 130, an output buffer 131 and a control core circuit 132.

The memory cell array 122 has a matrix of split gate memory cells 101, a plurality of word lines WLa to WLz, each commonly connected to the control gates CG of an associated row of memory cells 101, a plurality of bit lines BLa to BLz, each commonly connected to the drains D of an associated column of memory cells 101, and a common source line SL connected to the sources S of all memory cells. The word lines WLa–WLz are connected to a row decoder 123, and the bit lines BLa–BLz are connected to a column decoder 124. The common source line SL is connected to a ground.

The address pad 125 receives a row address and a column address supplied from an external unit (not shown) and then supplies those addresses to the address buffer 126. The address buffer 126 transfers the row address and column address to the address latch 127. The address latch 127 latches those addresses and transfers the row address to the row decoder 123 and the column address to the column decoder 124. The row decoder 123 selects one word line in accordance with the row address and controls the voltage applied to the selected word line WLm in accordance with the individual operation modes shown in FIG. 5. The column decoder 124 selects one bit line in accordance with the column address and controls the voltage applied to the selected bit line in accordance with the individual operation modes.

The data pad 128 receives data supplied from the external unit (not shown) and supplies the data to the input buffer 129. The input buffer 129 transfers the data to the column decoder 124. The column decoder 124 controls the voltage applied to any selected one of the bit lines BLa–BLz according to that data.

Data read from an arbitrary memory cell 101 is transferred from the selected bit line to the sense amplifier group 130 via the column decoder 124. The sense amplifier group 130 includes a plurality of sense amplifiers (not shown). The column decoder 124 operates to connect the selected bit line to the sense amplifiers. The sense amplifier group 130 discriminates the data and supplies it to an output buffer 131. The output buffer 131 supplies the data to the data pad 128. The thus read data is supplied from the data pad 128 to an external unit.

The control core circuit 140 controls the operations of the row decoder 123, the column decoder 124, the address pad 125, the address buffer 126, the address latch 127, the data pad 128, the input buffer 129, the sense amplifier group 130 and the output buffer 131.

In this specification, The names for the source S and the drain D of the split gate memory cell 101 are determined based on the reading operation; the terminal to which a high voltage is applied in the reading operation is called "drain" while the terminal to which a low voltage is applied is called "source". The same also applies to the determination of the names for those terminals in the writing operation and the erasing operation.

The individual operation modes (erase mode, write mode and read mode) of the flash EEPROM 121 will now be discussed with reference to FIG. 5.

(a) Erase Mode

In erase mode, a voltage of the ground level (0 V) is applied to all the bit lines BLa–BLz. A voltage of about +14 V is applied to a selected word line WLm and a voltage of the ground level is applied to the other, non-selected word lines WLa–WLl and WLn–WLz. Therefore, data is erased from all the memory cells 101 that are connected to the selected word line WLm as the electric potentials of the control gates CG of those memory cells 101 are pulled up to about +14 V.

When the electric potential of the control gate CG is about +14 V and the electric potential of the drain is 0 V, a high electric field is produced between the control gate CG and the floating gate FG so that a Fowler-Nordheim (FN) tunnel current flows between those gates. Consequently, electrons in the floating gate FG are pulled out to the control gate CG, resulting in data erasure. This erasing operation is based on the fact that the electrostatic capacitance between the drain D and the floating gate FG is significantly greater than that between the control gate CG and the floating gate FG. Simultaneous selection of a plurality of word lines WLa–WLz allows for data erasure of all the memory cells 101 that are connected to the selected individual word lines. This erasure is called "block erasure".

(b) Write Mode

In write mode, a voltage of about +1 V is applied to a selected word line WLm, and a voltage of the ground level is applied to the other, non-selected word lines WLa–WLl and WLn–WLz. A voltage of about +12 V is applied to a selected bit lines BLm, and a voltage of ground level is applied to the other, non-selected bit lines BLa–BLl and BLn–BLz. Consequently, the electric potential of the floating gate FG is pulled up by the capacitive coupling between the source S and the floating gate FG, thus producing a high electric field between the control gate CG and the floating gate FG. Thus, the electrons in the channel CH are accelerated to become hot electrons, which are injected into the floating gate FG. As a result, a charge is stored in the floating gate FG of the selected memory cell 101 and 1-bit data is written.

Each memory cell 101 has a threshold voltage Vth of +0.5 V and includes a transistor, which includes a control gate CG, source S and drain D. Therefore, electrons in the source S are moved in the channel CH in the weakly inverted state from P to N, so that the cell current flows to the drain D from the source S.

(c) Read Mode

In read mode, a voltage of about +5 V is applied to a selected word line WLm, and the voltage of the ground level is applied to the other, non-selected word lines WLa–WLl and WLn–WLz. A voltage of +2.5 V is applied to a selected bit line BLm and the voltage of the ground level is applied to the other, non-selected bit lines BLa–BLl and BLn–BLz. As a result, the cell current, which flows to the source S of the memory cell 101 in the erased state from the drain D, becomes greater than the cell current flowing in the memory cell 101 in the written state. This is because the channel CH directly below the floating gate FG of the data-erased memory cell is enabled, while the channel CH directly below the floating gate FG of the data-written memory cell is disabled in the memory cell in the written state.

More specifically, because electrons are drained from the floating gate FG of a data-erased memory cell, the floating gate FG is positively charged and has a electric potential higher than the threshold voltage. Therefore, the channel CH or the memory cell is enabled so that a current flows. As electrons are injected into the floating gate FG of a data-written memory cell, the floating gate FG is negatively charged and has a electric potential lower than the threshold voltage. The channel CH or memory cell is thus disabled so that a current does not flow.

Each sense amplifier in the sense amplifier group 130 discriminates the level of the cell current flowing in the associated memory cell as erase data "1" or write data "0". In this manner, binary data having a data value "1" indicating the erased state and a data value "0" indicating the written state may be stored in each memory cell.

(d) Standby Mode

In a standby mode, the voltage of the ground level is applied to the common source line SL, all the word lines WLa–WLz and all the bit lines BLa–BLz. In this standby mode, no operation (erase operation, write operation nor read operation) is performed on any memory cell 101.

FIG. 6 shows the individual operation modes of a flash EEPROM in which the source S of the split gate memory cell 101 is identified as a "drain" and the drain D is identified as a "source".

Figure 7A:
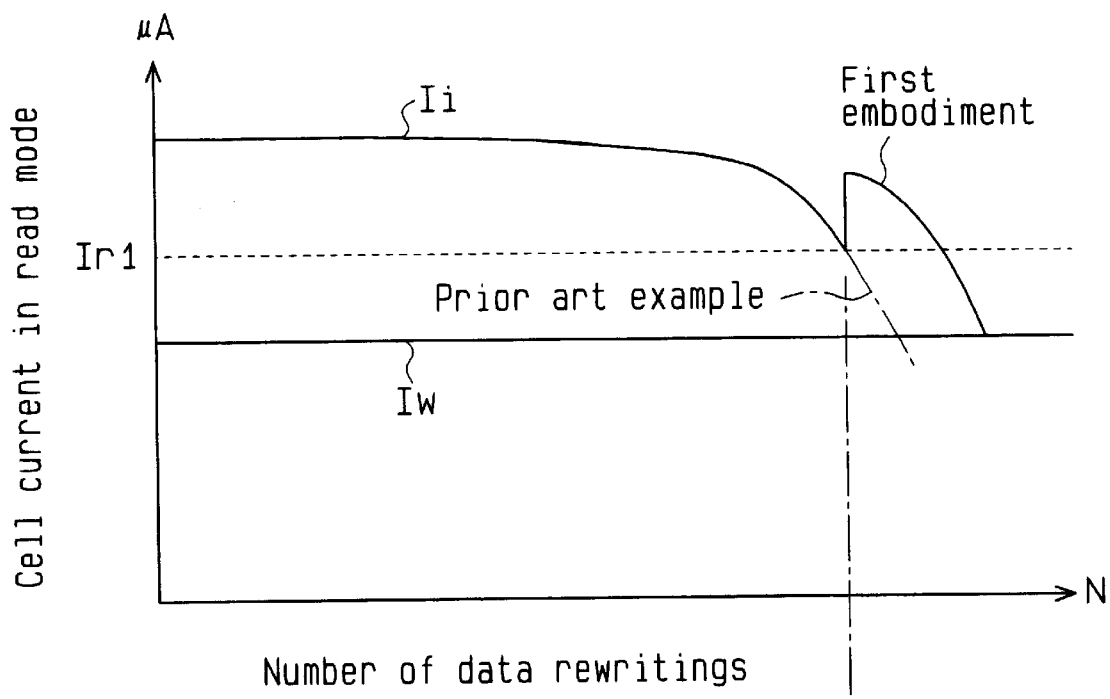
FIG. 7A is a graph showing the relationship between the current flowing in a memory cell in read mode and the number of data rewritings in the memory cell according to the first embodiment.
Figure 7B:
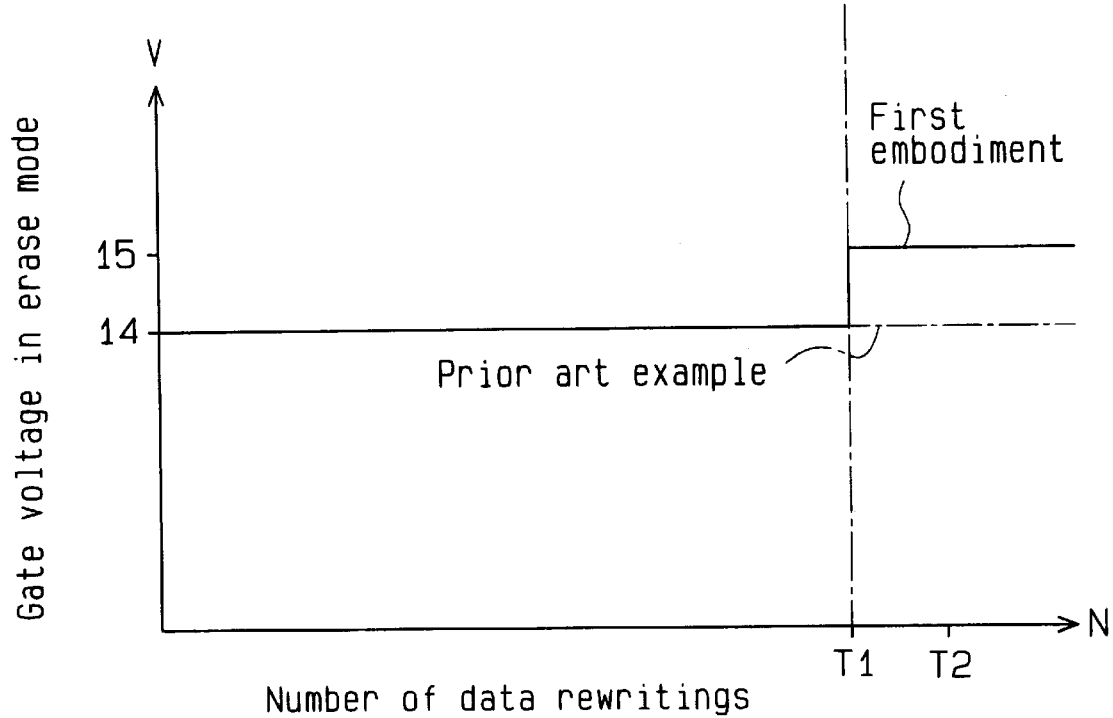
FIG. 7B is a graph showing the relationship between the gate voltage in erase mode and the number of data rewritings in the memory cell according to the first embodiment.

FIG. 7A is a graph showing the relationship between the number of data rewritings and the cell current in read mode. FIG. 7B is a graph showing the relationship between the number of data rewritings and the voltage Vg of the control gate electrode CG in erase mode.

Special Operation in Erase Mode

In the first embodiment, the control core circuit 132 counts the number of data rewritings. When the count value exceeds a predetermined value T1 in erase mode, the control core circuit 132 controls the row decoder 123 so that the voltage to be applied to the selected word line WLm is set to 15 V, higher by 1 V than the normal value (14 V). Then, the potentials of the control gate electrodes CG of the individual memory cells 101 connected to the selected word line WLm are pulled up to 15 V, as shown in FIG. 7B. At this time, the column decoder 124 applies the voltage of the ground level to all the bit lines BLa to BLz. As a result, the potential of the drain region D is set to 0 V.

Under this voltage control, when the number of data rewritings exceeds the predetermined value T1, the cell current Ii of the memory cell 101 in an erased state in read mode increases drastically, as shown in FIG. 7A. As the number of data rewritings increases thereafter, the cell current Ii decreases again. Given that T2 represents the number of data rewritings at the time the cell current Ii reaches a predetermined cell current value Ir1 again, the operational life of the memory cell 101 according to the first embodiment is extended to the number of data rewritings T2. Thus, the operational life of the flash EEPROM 121 using the memory cells 101 is also extended.

The predetermined value T1 corresponds to the number of data rewritings when the cell current Ii of the memory cell 101 in an erased state initially falls and reaches the predetermined cell current value Ir1. Specifically, the predetermined value T1 is acquired by conducting an experiment regarding the reduction of the cell current Ii with respect to the number of data rewritings on many memory cells 101. In other words, the predetermined value T1 represents the limit of the number of data rewritings according to the prior art.

According to the first embodiment, even if electron traps increase in the silicon oxide film 104 with an increase in the number of data rewritings, electrons in the floating gate electrode FG are drained sufficiently. This is because, when the number of data rewritings exceeds the predetermined value T1, the floating gate electrode FG of the memory cell 101 in an erased state is charged more positively. This charging occurs when a high voltage (15 V) is applied to the control gate electrode CG with the potential of the drain region D set to 0 V. The application of the high voltage generates a higher electric field between the control gate electrode CG and the floating gate electrode FG. That is, when the number of data rewritings exceeds the predetermined value T1, the electric field produced between the gate electrodes CG and FG becomes higher by an increase in the voltage of the control gate electrode CG. Consequently, the FN tunnel current, which flows toward the floating gate electrode FG from the control gate electrode CG, increases due to the increased voltage of the control gate electrode CG. As the FN tunnel current increases, the electrons in the floating gate electrode FG are drained toward the control gate electrode CG more effectively, thus erasing data.

According to the first embodiment, as in the prior art, the cell current Iw of the memory cell 101 in a data written state stays unchanged regardless of the number of data rewritings. When the number of data rewritings exceeds predetermined T1, by contrast, the cell current Ii increases. This increases the difference between the cell current Iw and the cell current Ii, making it possible to accurately determine whether each memory cell 101 is in a written state or an erased state. That is, data stored in the memory cell 101 is read out accurately. The correct data reading is carried out until the cell current Ii decreases again and falls below the predetermined cell current value Ir1.

FIG. 8 is a graph showing the relationship between the time required for data erasing operation and the current flowing in a memory cell in read mode. The graph shows that when a data erasing operation is performed for a time T3, for example, the current Ii flowing in a memory cell, the control gate of which has 15 V applied thereto, is greater than the current Ii flowing in a memory cell, the control gate of which has 14 V applied thereto. Even if the number of data rewritings exceeds the predetermined value T1, therefore, data stored in any memory cell is determined correctly.

Second Embodiment

Figure 9:
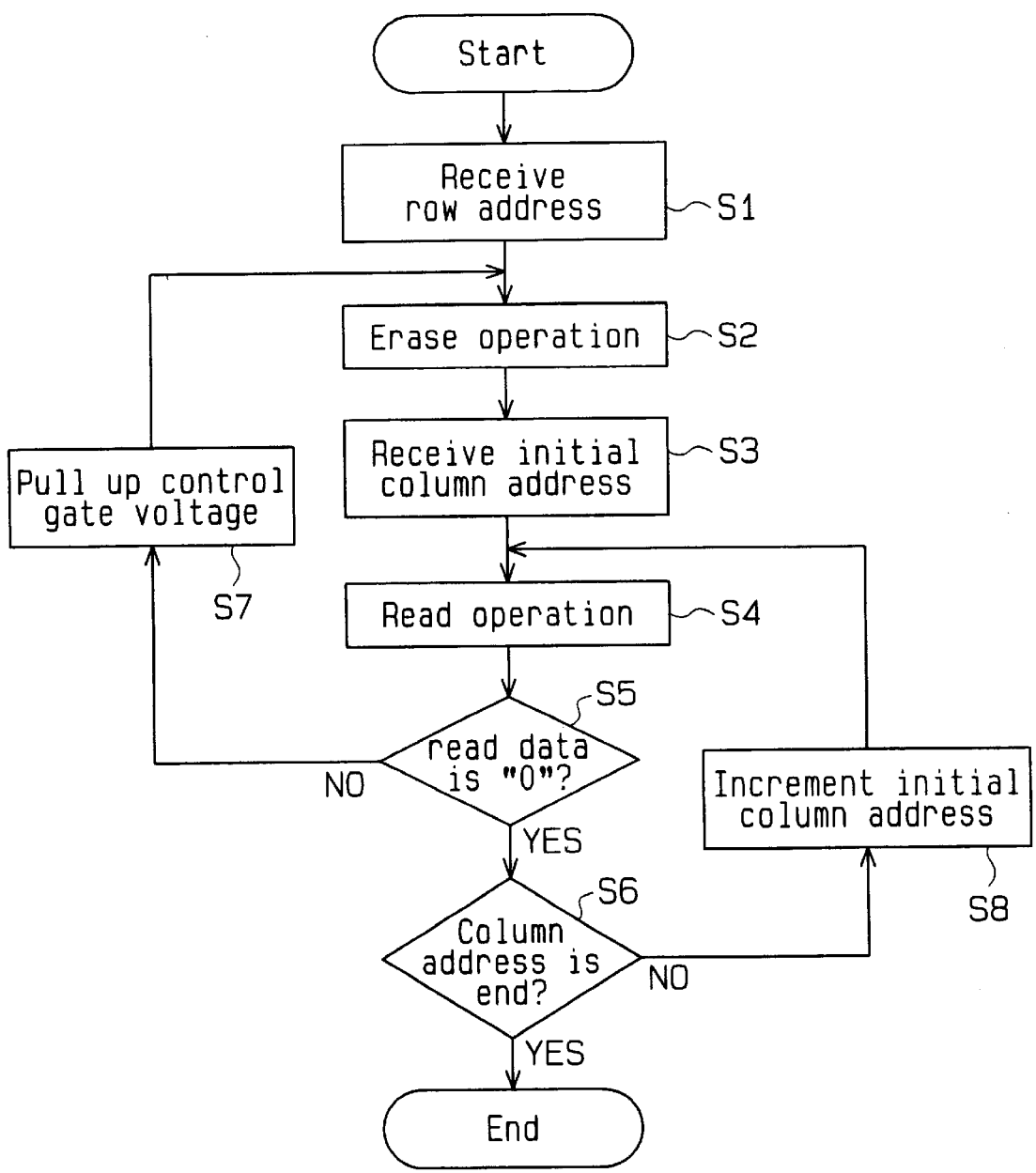
FIG. 9 is a flowchart for the erasing operation of a flash EEPROM having split gate memory cells according to a second embodiment of the invention.

The second embodiment is the same as the first embodiment in the write mode and read mode, but they differ from each other in the erase mode. FIG. 9 presents a flowchart for explaining an erase mode operation according to the second embodiment. When the erase mode starts, first, the address pad 125 receives the row address that has been designated by an external unit in step S1. The row address is transferred to the row decoder 123.

In the next step S2, the row decoder 123 selects one of the word lines WLa–WLz in accordance with the row address, and applies the voltage having a normal value (14 V) to the selected word line WLm while applying the voltage of the ground level to the other (non-selected) word lines WLa–WL1 and WLn–WLz. As a result, data stored in every memory cell 101 connected to the selected word line WLm is erased.

In the subsequent step S3, the address pad 125 receives the initial column address. The initial column address is transferred to the column decoder 124. Next, the column decoder 124 selects the bit line BLa in accordance with the initial column address in step S4. The read operation is executed under the conditions shown in FIG. 5 to read data stored in the memory cell 101 that is connected to the selected word line WLm and the selected bit line BLa.

In the next step S5, data read in step S4 is determined. If data stored in the memory cell 101 has been erased completely in step S2, the read data should be "0". In other words, if the read data is "1", the data stored in that memory cell 101 has not been erased completely. The flow proceeds to step S6 when the read data is "0" and goes to step S7 when the data is "1".

In step S7, the row decoder 123 applies the voltage of 15 V, higher by 1 V than the normal value (14 V), to the selected word line WLm in order to pull up the potential of the control gate electrode CG. Then, the flow returns to step S2 to erase data stored in all the memory cells 101 connected to the selected word line WLm again.

In step S6, it is determined if the column address is the end address or not. When it is the end address, the erase mode is terminated. When the column address is not the end address, the flow proceeds to step S8. In the case of the initial column address, the flow goes to step S8 to increment the initial column address. The incremented column address is used in the read operation in step S4. In step S4, the column decoder 124 selects another bit line BLb in accordance with the incremented column address. Then, data is read from another memory cell 101 which is connected to both the selected word line WLm and bit line BLb. The routine of steps S4 to S6 and S8 is repeated in the above-described manner, and the voltage to be applied to the selected word line WLm is increased by 1 V increments each time in step S7 until every memory cell 101 connected to the selected word line WLm is erased completely. This voltage increase is not limited to increments of 1 V, but may be carried out in increments of 1.5 V or 2 V. Note however that when a very high voltage is applied to the control gate electrode CG, the electrons that pass the silicon oxide film 104 increase, thus increasing the stress on the silicon oxide film 104. It is therefore preferable that the voltage of the control gate electrode CG be set to the optimal value in the light of the stress on the silicon oxide film 104. As apparent from the above, it is possible to completely erase data from all the memory cells in erase mode according to the second embodiment, thereby ensuring a prolonged life of the memory cells.

Third Embodiment

Figure 10:
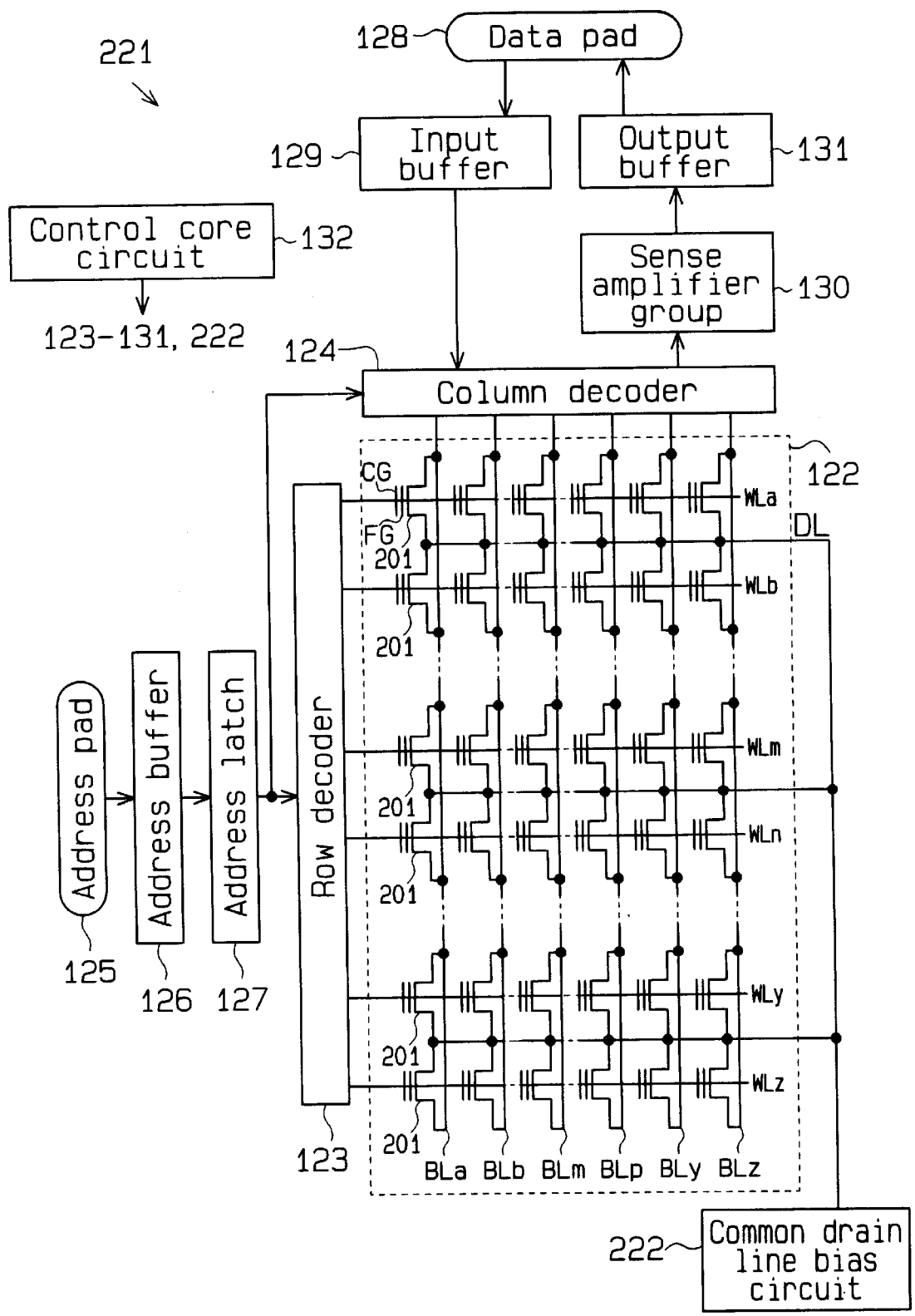
FIG. 10 is a block diagram of a flash EEPROM having stacked gate memory cells according to a third embodiment of the invention.

A flash EEPROM having stacked gate NOR type memory cells according to a third embodiment of the present invention will now be described with reference to the accompanying drawings. FIG. 10 is a block diagram showing a flash EEPROM 221 having stacked gate NOR type memory cells 201. This flash EEPROM 221 mainly differs from the conventional flash EEPROM 121 of the first embodiment in the following three points:

(1) The memory cell array 122 has a plurality of stacked gate NOR type memory cells 201 arranged in a matrix form at the intersections between a plurality of word lines WLa–WLz and a plurality of bit lines BLa–BLz.

(2) The sources S of the individual memory cells 201 aligned in individual rows are commonly connected to the associated bit lines BLa–BLz.

(3) The drains D of all the memory cells 201 are connected to a common drain line bias circuit 222 via a common drain line DL. The common drain line bias circuit 222 controls the voltage to be applied to the common drain line DL in accordance with the individual operational mode under the control of a control core circuit 132.

The names for the source S and the drain D of the stacked gate memory cell 201b are determined based on the reading operation; the terminal to which a high voltage is applied in the reading operation is called "drain" while the terminal to which a low voltage is applied is called "source". The same applies to the determination of the names for those terminals, the source S or the drain D, even in the writing operation and the erasing operation.

The individual operational modes (erase mode, write mode and read mode) of the conventional flash EEPROM 221 will now be discussed referring to FIG. 11.

(a) Erase mode

In the erase mode, all the bit lines BLa–BLz are set in the open state and a voltage of the ground level is applied to the selected word line WLm. The common drain line bias circuit 222 applies +12 V to the drains D of all the memory cells 201 via the common drain line DL. As a result, the FN tunnel current flows and the electrons in the floating gates FG are drained toward the drains D to erase data stored in the memory cells 201. This erasing operation is executed for all the memory cells 201 connected to the selected word line WLm. Erasure (block erasure) may be performed on all the memory cells 201 connected to a plurality of word lines WLa–WLz that are selected simultaneously. In the erase mode, +12 V may be applied to the substrate 202 instead of the drain D. In this case, all the bit lines Bla–BLz (source S) and the common drain line DL (drain D) are set in the open state. Furthermore, +12 V may be applied to both of the drain D and the substrate 202 to erase data.

(b) Write Mode

In the write mode, +12 V is applied to the selected word line WLm (control gate CG), and the voltage of the ground level is applied to the non-selected word lines WLa–WLl and WLn–WLz. +5 V is applied to the selected bit line BLm (source S), and the voltage of the ground level is applied to the non-selected bit lines BLa–BLl and BLn–BLz. The common drain line bias circuit 222 maintains the voltage to be applied to the drains D of all the memory cells 201 via the common drain line DL at the ground level. Consequently, the electric potentials of the floating gates FG are pulled up and hot electrons produced in the vicinity of the sources S are supplied into the floating gates FG. As a result, a charge is stored in the floating gates FG of the selected memory cells 201 and 1-bit data is written there.

(c) Read Mode

In the read mode, +5 V is applied to the selected word line WLm and the voltage of the ground level is applied to the non-selected word lines WLa–WLl and WLn–WLz. The voltage of the ground level is applied to all the bit lines BLa–BLz. The common drain line bias circuit 222 applies +5 V to the drains D of all the memory cells 201 via the common drain line DL. As a result, the cell current that flows to the source S of any erased memory cell 201 from the drain D thereof becomes greater than the cell current flowing in any memory cell 201 in the written state. By utilizing this phenomenon, the data value "1" is read from the erased memory cell 201 and the data value "0" is read from the written memory cell 201.

(d) Standby Mode

In a standby mode, the voltage of the ground level is applied to the common source line SL, all the word lines WLa–WLz and all the bit lines BLa–BLz. In this standby mode, no operation (neither erase operation, write operation nor read operation) is performed on any memory cell 201.

Figure 12A:
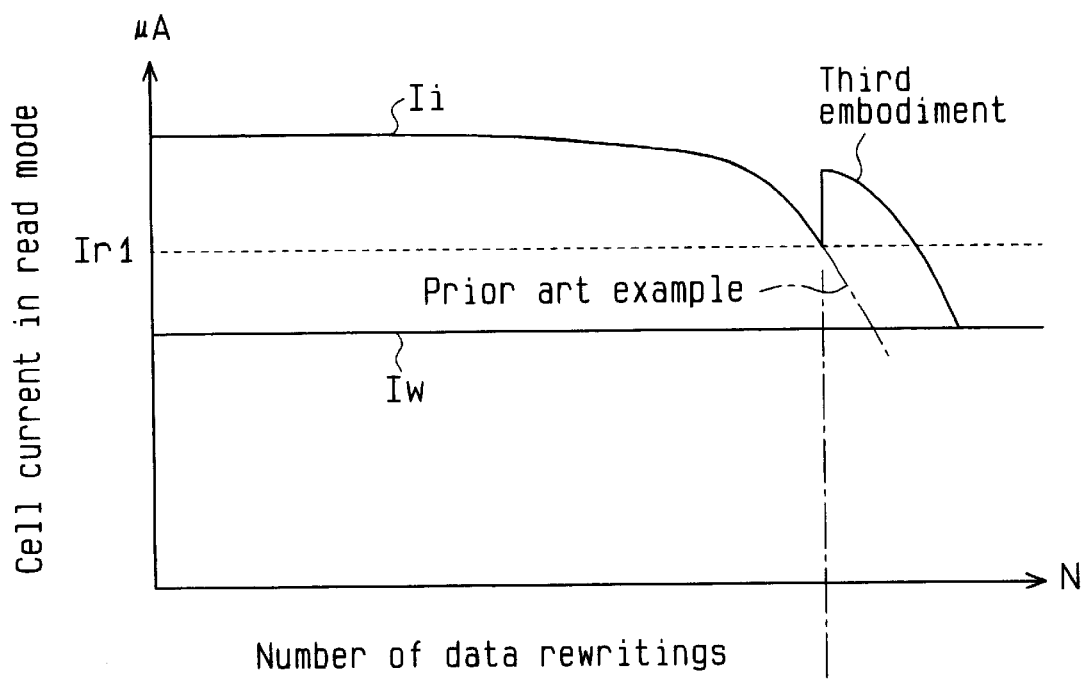
FIG. 12A is a graph showing the relationship between the current flowing in a memory cell in read mode and the number of data rewritings in the memory cell according to the third embodiment.
Figure 12B:
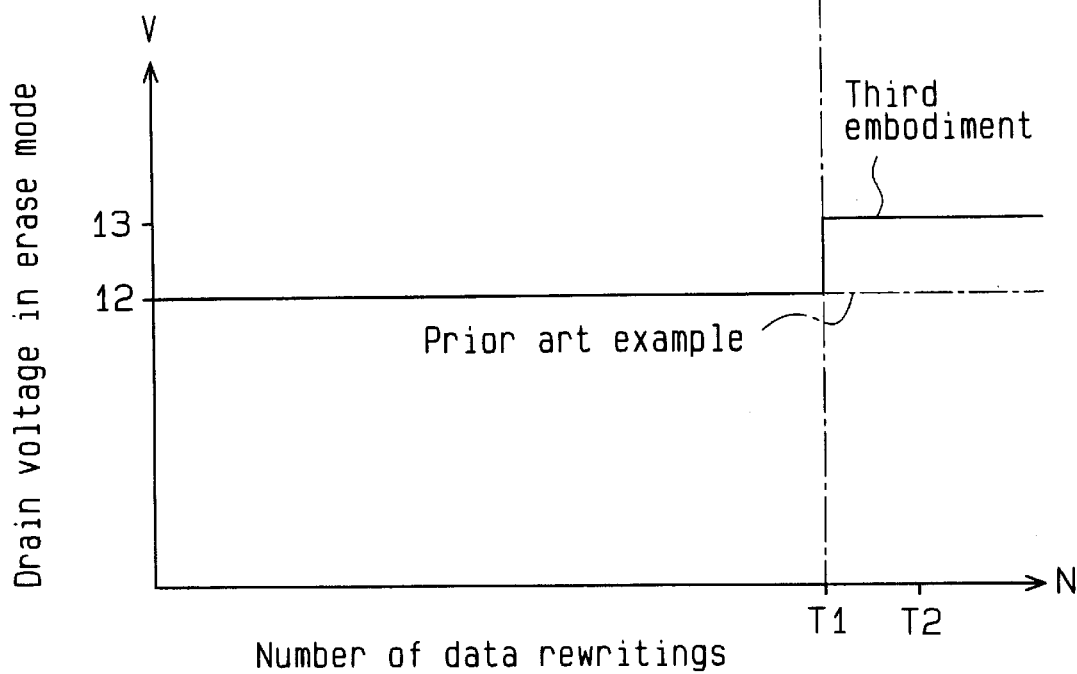
FIG. 12B is a graph depicting the relationship between the drain voltage in erase mode and the number of data rewritings in the memory cell according to the third embodiment.

FIG. 12A is a graph showing the relationship between the current flowing in a memory cell in read mode and the number of data rewritings in the memory cell. FIG. 12B is a graph depicting the relationship between the voltage Vd of the drain D in erase mode and the number of data rewritings in the memory cell according to the third embodiment.

Special Operation in Erase Mode

In the third embodiment, the control core circuit 132 counts the number of data rewritings. When the count value exceeds the predetermined value T1 in erase mode, the control core circuit 132 controls the common drain line bias circuit 222 so that the applied voltage to the common drain line DL is set to 13 V, higher by 1 V than the normal value (12 V). Then, the potentials of the drain regions D of all the memory cells 201 are pulled up to 13 V. The control core circuit 132 further controls the row decoder 123 so that the applied voltage to the non-selected word lines WLa–WLl and WLn–WLz is set to 13 V, higher by 1 V than the normal value (12 V). Then, the potentials of the control gate electrodes CG of the individual memory cells 201 connected to non-selected word lines WLa–WLl and WLn–WLz are pulled up to 13 V, as shown in FIG. 12B. At this time, the row decoder 123 applies the voltage of the ground level to the selected word line WLm. Further, the column decoder 124 holds all the bit lines BLa–BLz open.

Under this voltage control, when the number of data rewritings exceeds the predetermined value T1, the cell current Ii of the memory cell 201 in an erased state in read mode increases drastically, as shown in FIG. 12A. Thereafter, the cell current Ii decreases again as the number of data rewritings increases. Given that T2 represents the number of data rewritings at the time the cell current Ii reaches the predetermined cell current value Ir1 again, the operational life of the memory cell 201 according to the third embodiment is extended to the number of data rewritings T2. As a result, the operational life of the flash EEPROM 221 using the memory cells 201 is also extended.

The predetermined value T1 corresponds to the number of data rewritings when the cell current Ii of the memory cell in an erased state initially falls and reaches the predetermined cell current value Ir1. Specifically, the predetermined value T1 is acquired by conducting an experiment regarding the reduction of the cell current Ii with respect to the number of data rewritings on many memory cells 201. That is, the predetermined value T1 indicates the limit of the number of data rewritings according to the prior art.

According to the third embodiment, even if electron traps increase in the silicon oxide film 204 with an increase in the number of data rewritings, electrons in the floating gate electrode FG are drained sufficiently. This is because, when the number of data rewritings exceeds the predetermined value T1, the floating gate electrode FG of the memory cell 201, in an erased state, is charged more positively. This charging occurs when a high voltage (13 V) is applied to the drain region D with the potential of the control gate electrode CG set to 0 V. The application of the high voltage generates a higher electric field between the control gate electrode CG and the floating gate electrode FG. That is, when the number of data rewritings exceeds the predetermined value T1, the electric field generated between the floating gate electrode FG and the drain region D becomes higher by an increase in the voltage of the drain region D. Accordingly, the FN tunnel current, which flows toward the control gate electrode CG from the drain region D, increases due to the increased voltage of the drain region D. As the FN tunnel current increases, the electrons in the floating gate electrode FG are drained toward the drain region D more effectively, thus erasing data.

According to the third embodiment, as in the prior art, the cell current Iw of the memory cell 201 in a data written state stays unchanged regardless of the number of data rewritings. When the number of data rewritings exceeds predetermined T1, by contrast, the cell current Ii increases. This increases the difference between the cell current Iw and the cell current Ii, making it possible to accurately determine whether each memory cell 201 is in a written state or an erased state. That is, data stored in the memory cell 201 is read out accurately. The correct data reading is carried out until the cell current Ii decreases again and falls below the predetermined cell current value Ir1.

Figure 13:
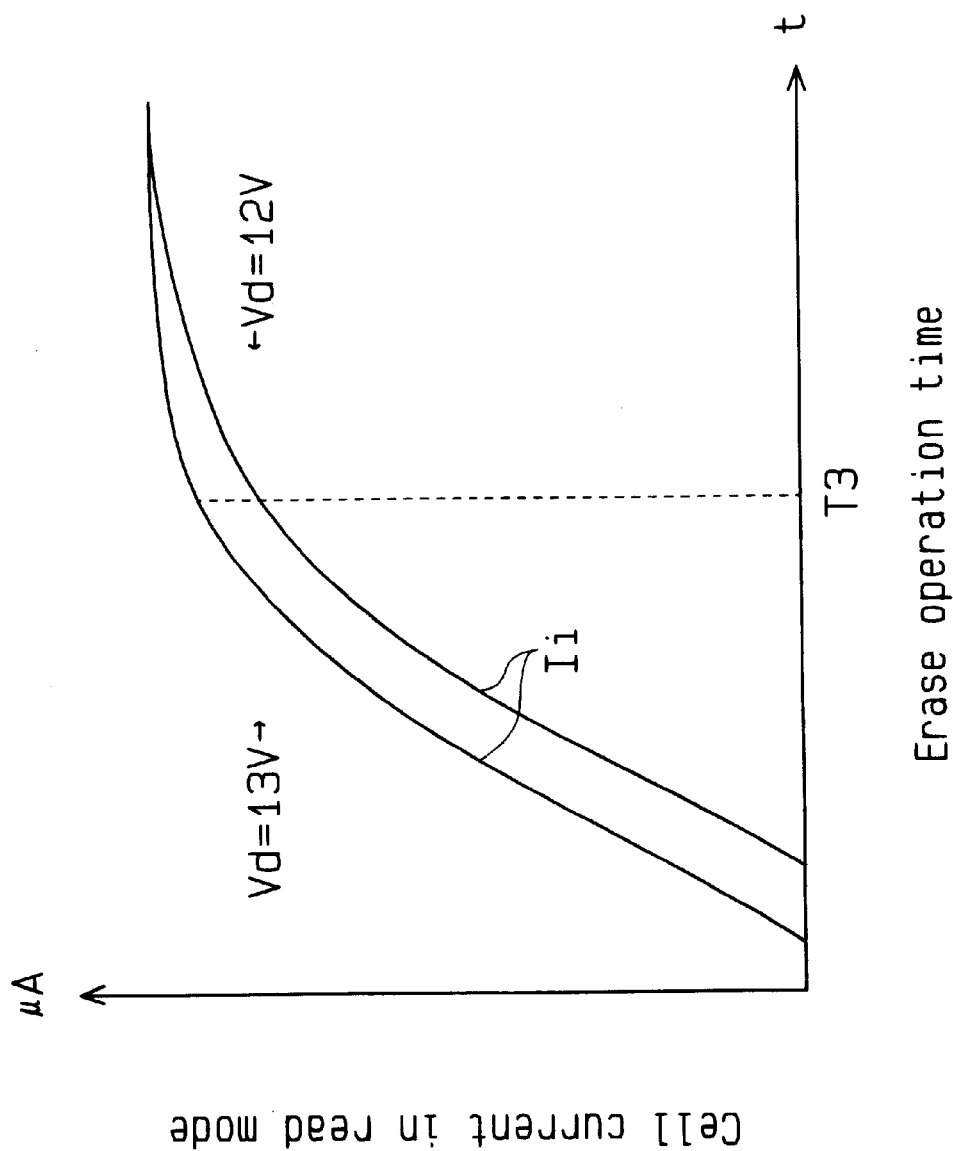
FIG. 13 is a graph illustrating the relationship between the current flowing in a memory cell in read mode and the erasing operation time.

FIG. 13 is a graph showing the relationship between the time required for data erasing operation and the current flowing in a memory cell in read mode. The graph shows that in the case where data erasing operation is performed for a time T3, for example, the current Ii flowing in a memory cell when 13 V is applied to the drain region D is larger than the current Ii flowing in a memory cell when 12 V is applied to the drain region D. Even if the number of data rewritings exceeds the predetermined value T1, therefore, data stored in any memory cell is determined correctly.

Fourth Embodiment

Figure 14:
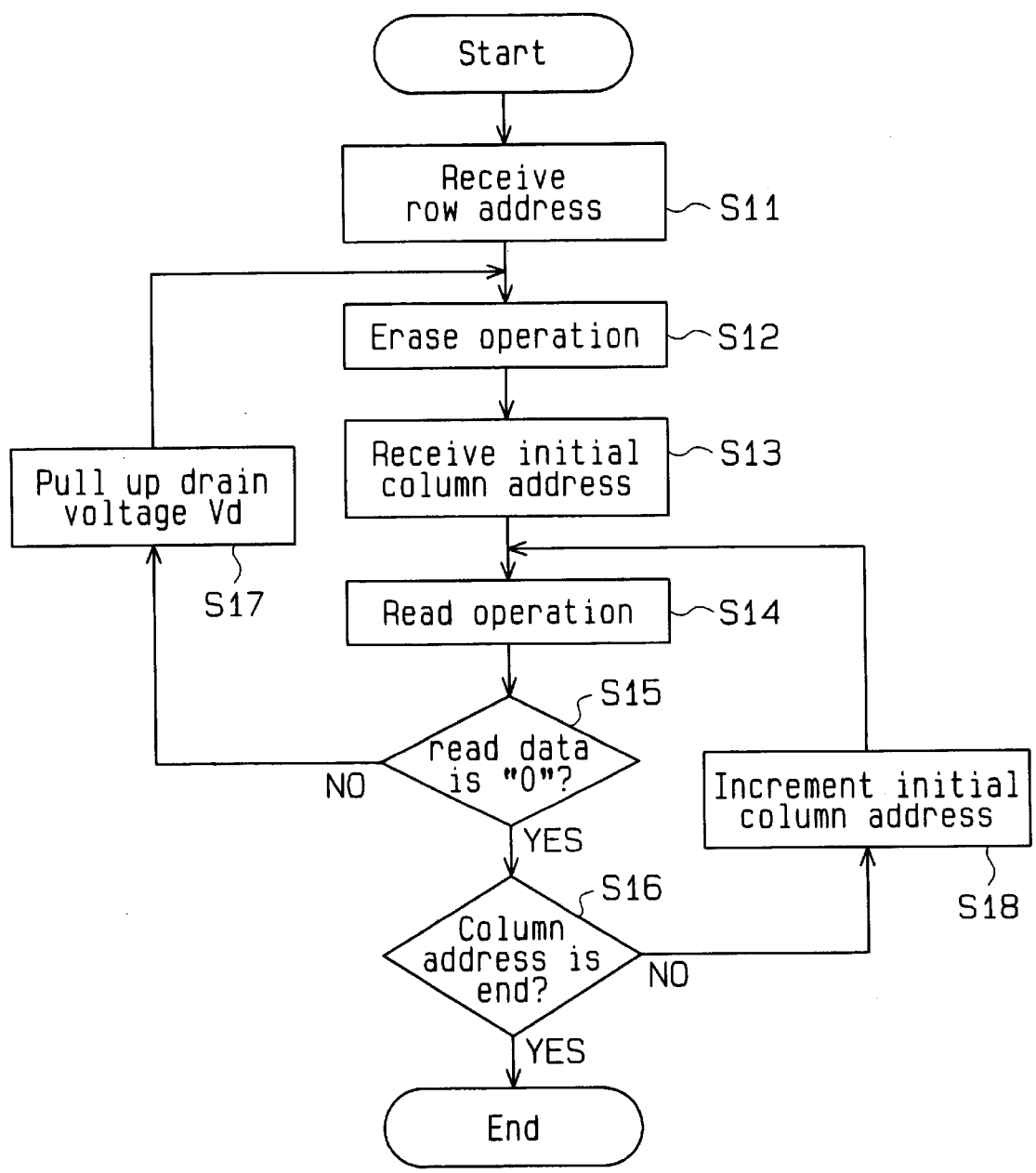
FIG. 14 is a flowchart for the operation of a flash EEPROM having stacked gate memory cells according to a fourth embodiment of the invention in erase mode.

The fourth embodiment is the same as the third embodiment in the write mode and read mode, but they differ from each other in the erase mode. FIG. 14 is a flowchart for explaining an operation in erase mode according to the fourth embodiment. When the erase mode starts, first, the row address that has been designated by an external unit is transferred to the row decoder 123 in step S11.

In the next step S12, the row decoder 123 selects one of the word lines WLa–WLz in accordance with the row address and applies the voltage having the ground level to the selected word line WLm while applying the voltage of the normal level (12 V) to the other (non-selected) word lines WLa–WLl and WLn–WLz. The common drain line bias circuit 222 applies the voltage having the normal level (12 V) to the common drain line DL. Consequently, data stored in every memory cell 201 connected to the selected word line WLm is erased.

Next, the initial column address is transferred to the column decoder 124 in step S13. Then, the column decoder 124 selects the bit line BLa in accordance with the initial column address in step S14. The read operation is executed under the conditions shown in FIG. 11 to read data stored in the memory cell 201 that is connected to both the selected word line WLm and bit line BLa.

In the subsequent step S15, data read in step S14 is determined. If data stored in the memory cell 201 has been erased completely in step S12, the read data should be "0". In other words, if the read data is "1", the data stored in that memory cell 201 has not been erased completely. The flow proceeds to step S16 when the read data is "0" and goes to step S17 when the data is "1".

In step S17, the common drain line bias circuit 222 applies the voltage of 13 V, higher by 1 V than the normal value (12 V), to the common drain line DL in order to pull up the potentials of the drain regions D of all the memory cells 201. Further, the row decoder 123 applies the voltage of 13 V, higher by 1 V than the normal value (12 V), to the non-selected word lines WLa–WLl and WLn–WLz in order to pull up the potentials of the control gate electrodes CG of the non-selected memory cells 201. Then, the flow returns to step S12 to erase data from all the memory cells 201 connected to the selected word line WLm with the potentials of both the drain regions D of all the memory cells 201 and the control gate electrodes CG of the non-selected memory cells 201 pulled up to 13 V.

In step S16, it is determined whether the column address is the end address or not. When it is the end address, the erase mode is terminated. When the column address is not the end address, the flow proceeds to step S18. In step S18, the column address is incremented, and the incremented column address is used in the read operation in step S14. In step S14, the column decoder 124 selects another bit line BLb in accordance with the incremented column address. Then, data is read from another memory cell 201 that is connected to both the selected word line WLm and bit line BLb. The routine of steps S14 to S16 and S18 is repeated in this manner, and the voltages to be applied to the common drain line DL and the non-selected word lines WLa–WL1 and WLn–WLz are increased by 1 V increments each time in step S17 until every memory cell 201 is erased completely. As apparent from the above, it is possible to completely erase data from all the memory cells in erase mode according to the fourth embodiment, thereby ensuring the extended life of the memory cells.

It should be apparent to those skilled in the art that the present invention may be embodied in many other specific forms without departing from the spirit or scope of the invention. Particularly, it should be understood that the invention may be embodied in the following forms.

Figure 15A:
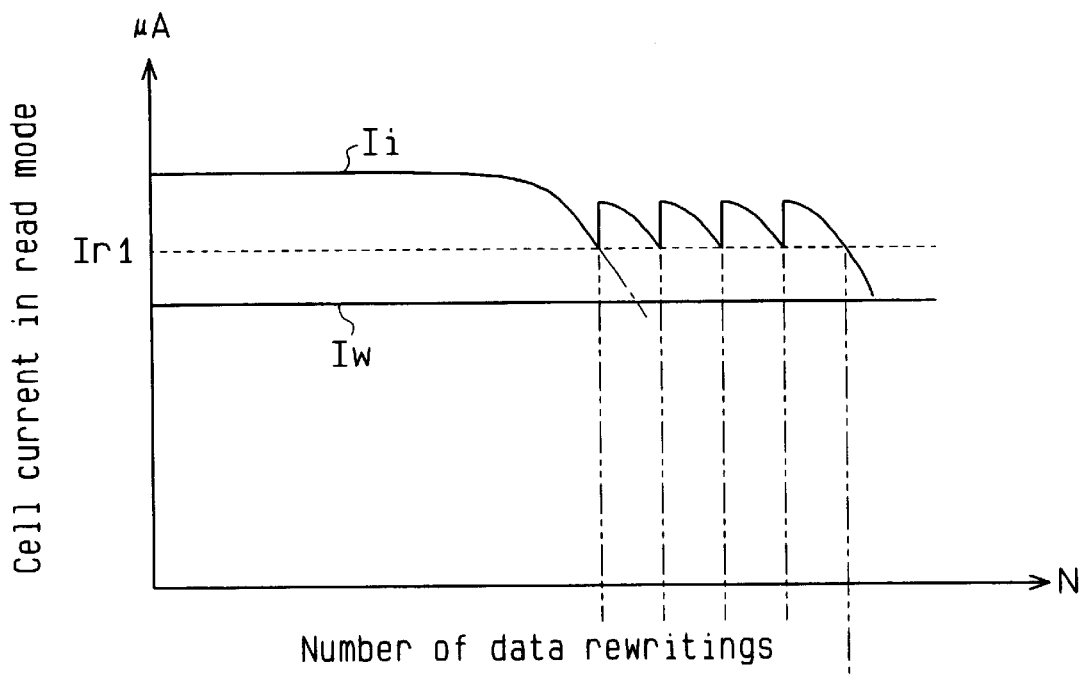
FIG. 15A is a graph showing the relationship between the current flowing in a memory cell in read mode and the number of data rewritings in the memory cell according to a modification of the first embodiment.
Figure 15B:
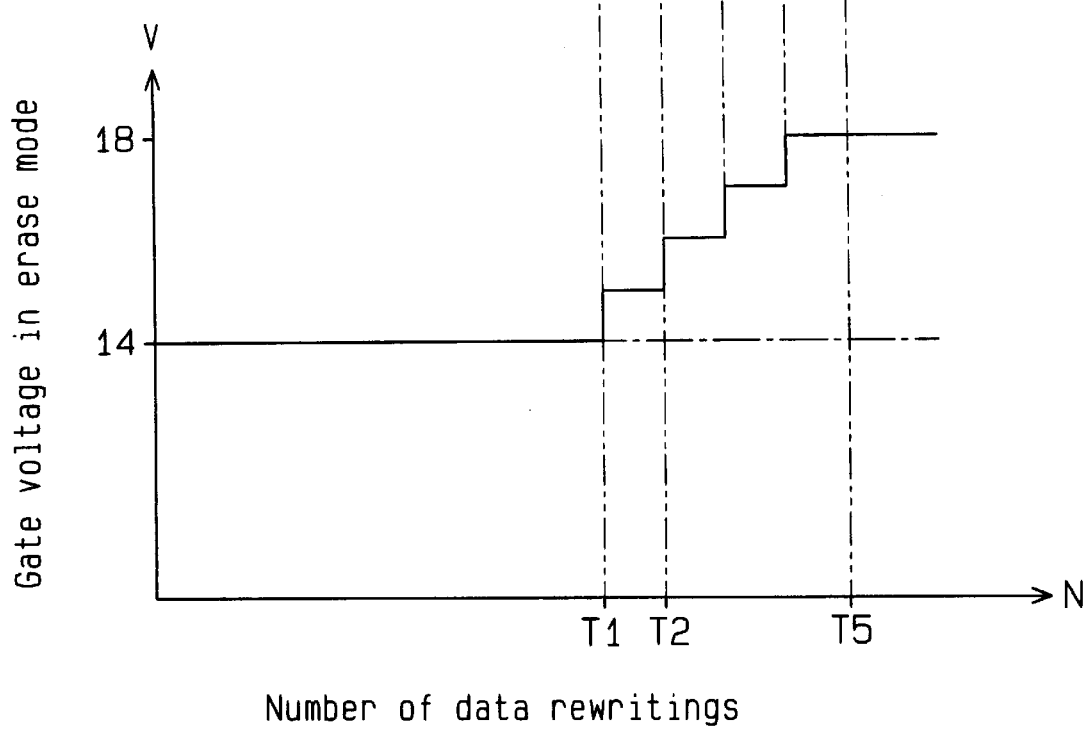
FIG. 15B is a graph showing the relationship between the gate voltage in erase mode and the number of data rewritings in the memory cell according to that modification.

(1) In the first embodiment, the voltage to be applied to the selected word line WLm may be increased in increments of 1 V every time an increase in the number of data rewritings causes the cell current Ii of the memory cell 101 to fall and reach the cell current value Ir1. As shown in FIGS. 15A and 15B, for example, the voltage to be applied to the selected word line WLm in erase mode may be increased four times step by step, by 1 V per step. According to this scheme, the number of data rewritings increases to four times that in the first embodiment (T5−T1=4×(T2−T1)). It is, however, preferable that the voltage to be applied to the selected word line WLm in erase mode should be set equal to or smaller than the breakdown voltage of each silicon oxide film 103 or 104.

Figure 16A:
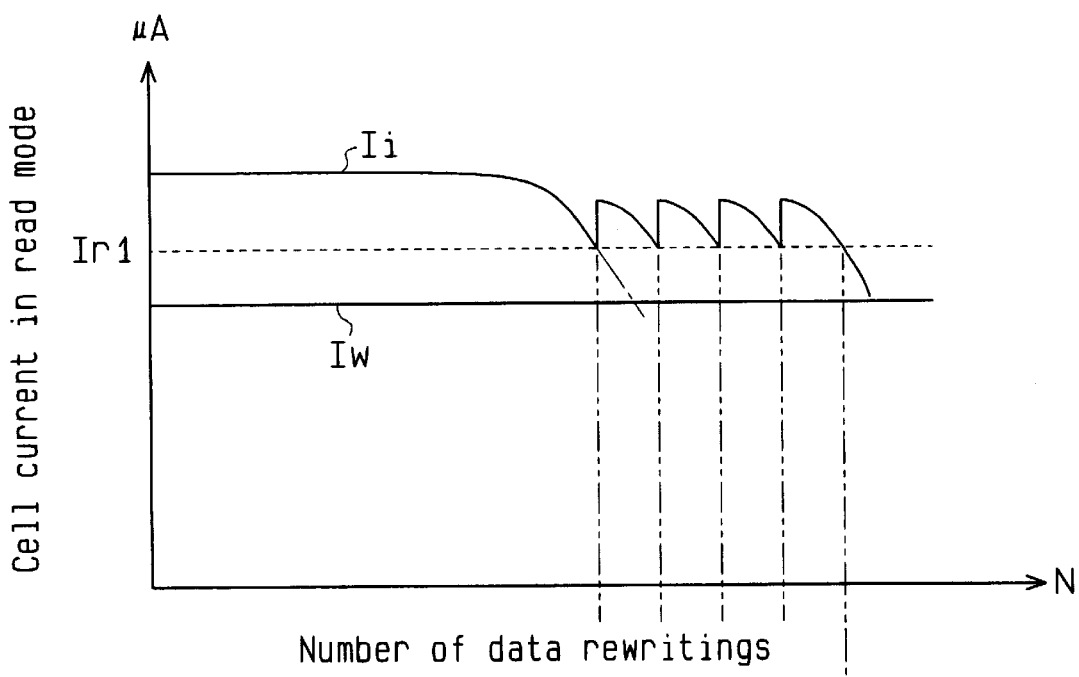
FIG. 16A is a graph showing the relationship between the current flowing in a memory cell in read mode and the number of data rewritings in the memory cell according to a modification of the third embodiment.
Figure 16B:
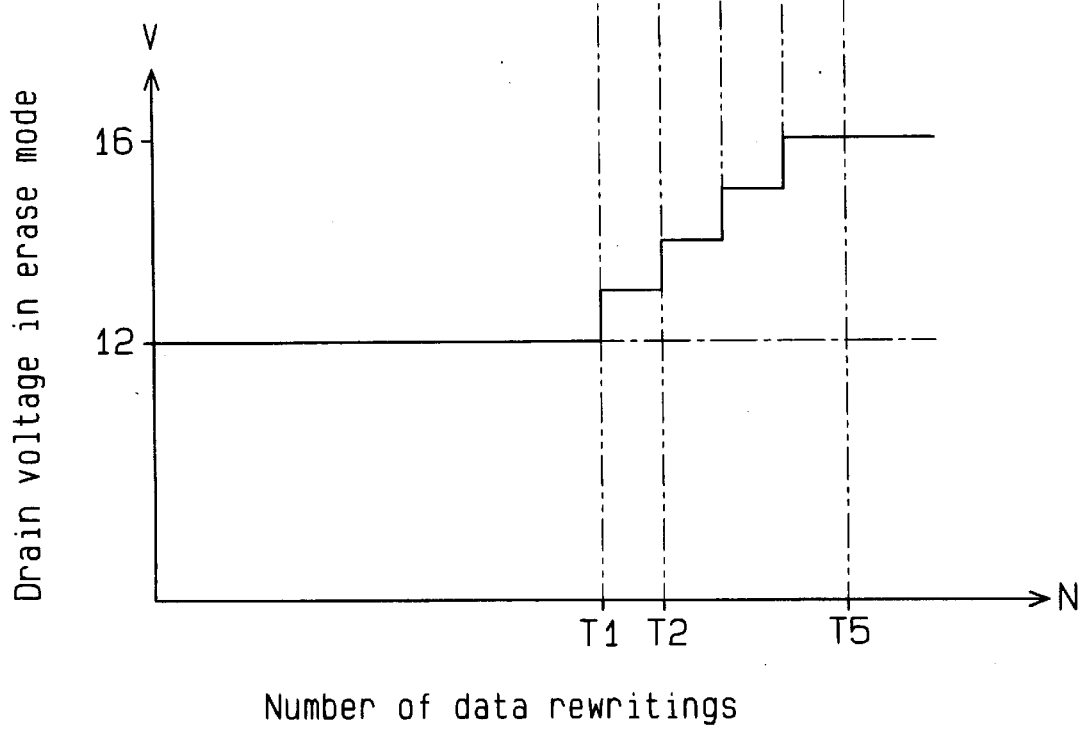
FIG. 16B is a graph showing the relationship between the drain voltage in erase mode and the number of data rewritings in the memory cell according to that modification.

(2) In the third embodiment, the voltages to be applied to the common drain line DL and the non-selected word lines WLa–WL1 and WLn–WLz may be increased in increments of 1 V every time an increase in the number of data rewritings causes the cell current Ii of the memory cell 201 in an erased state to decrease and reach the cell current value Ir1. As shown in FIGS. 16A and 16B, for example, the voltages to be applied to the common drain line DL and the non-selected word lines WLa–WL1 and WLn–WLz in erase mode may be increased four times step by step, by 1 V per step. This scheme increases the number of data rewritings to four times that of the third embodiment (T5−T1=4×(T2−T1)). It is, however, preferable that the voltages to be applied to the common drain line DL and the non-selected word lines WLa–WL1 and WLn–WLz in erase mode should be set equal to or smaller than the breakdown voltage of each silicon oxide film 203 or 204.

(3) In the first and second embodiments, this invention may be adapted to a memory cell 101 the source region S of which is the drain region and drain region D of which is the source region.

Therefore, the present examples and embodiments are to be considered as illustrative and not restrictive and the invention is not to be limited to the details given herein, but may be modified within the scope and equivalence of the appended claims.

What is claimed is:

1. A non-volatile semiconductor memory device capable of rewriting data, comprising:

a split gate type memory cell having a semiconductor substrate, a floating gate electrode located over the semiconductor substrate, and a control gate electrode located over the floating gate electrode and the semiconductor substrate, the floating gate electrode storing a charge and being capacitively coupled to the control gate electrode, wherein it is determined whether or not data is stored in the split gate type memory cell in accordance with the quantity of charge stored in the floating gate electrode; and a control unit for controlling the voltage applied to the control gate electrode so that data is erased by pulling out the charge stored in the floating gate electrode using a Fowler-Nordheim tunnel current, which flows from the control gate electrode to the floating gate electrode, wherein said control unit counts a number of data rewritings and controls the voltage applied to the control gate electrode so that the Fowler-Nordheim tunnel current increases to sufficiently pull out the charge stored in the floating gate electrode when the number of data writings exceeds a predetermined number.

2. The memory device according to claim 1, said control unit adds a predetermined voltage to a normally applied voltage to increase the voltage applied to the control gate electrode.

3. The memory device according to claim 2, said control unit adds the predetermined voltage to the normally applied voltage in a step-like manner each time the Fowler-Nordheim tunnel current falls and reaches a predetermined current value.

4. A non-volatile semiconductor memory device capable of rewriting data, comprising:

a stacked gate type memory cell having a semiconductor substrate, a drain region defined on the a semiconductor substrate, and a floating gate electrode located over the semiconductor substrate, the floating gate storing a charge and being capacitively coupled to the drain region, wherein it is determined whether or not data is stored in the stacked gate type memory cell in accordance with the quantity of charge stored in the floating gate electrode; and a control unit for controlling the voltage applied to at least one of the drain region and the semiconductor substrate so that data is erased by pulling out the charge stored in the floating gate electrode using a Fowler-Nordheim tunnel current, which flows from at least one of the drain region and the semiconductor substrate to the floating gate electrode, wherein said control unit counts a number of data rewritings and controls the voltage applied to at least one of the drain region and the semiconductor substrate so that the Fowler-Nordheim tunnel current increases to sufficiently pull out the charge stored in the floating gate electrode when the number of data writings exceeds a predetermined number.

5. The memory device according to claim 4, said control unit adds a predetermined voltage to a normally applied voltage to increase the voltage applied to at least one of the drain region and the semiconductor substrate.

6. The memory device according to claim 5, said control unit adds the predetermined voltage to the normally applied voltage in a step-like manner each time the Fowler-Nordheim tunnel current falls and reaches a predetermined current value.

7. A non-volatile semiconductor memory device comprising:

a split gate type memory cell having a semiconductor substrate, a floating gate electrode located over the semiconductor substrate, and a control gate electrode located over the floating gate electrode and the semiconductor substrate, the floating gate electrode storing a charge and being capacitively coupled to the control gate electrode, wherein it is determined whether or not data is stored in the split gate type memory cell in accordance with the quantity of charge stored in the floating gate electrode; and a control unit for controlling the voltage applied to the control gate electrode so that data is erased by pulling out the charge stored in the floating gate electrode using a Fowler-Nordheim tunnel current, which flows from the control gate electrode to the floating gate electrode, wherein said control unit determines whether or not data is erased and controls the voltage applied to the control gate electrode so that the Fowler-Nordheim tunnel current increases to sufficiently pull out the charge stored in the floating gate electrode when data is not erased.

8. The memory device according to claim 7, said control unit adds a predetermined voltage to a normally applied voltage to increase the voltage applied to the control gate electrode.

9. The memory device according to claim 8, said control unit increases the voltage applied to the control gate electrode until data is erased completely.

10. A non-volatile semiconductor memory device comprising:

a stacked gate type memory cell having a semiconductor substrate, a drain region defined on the semiconductor substrate, and a floating gate electrode located over the semiconductor substrate, the floating gate storing a charge and being capacitively coupled to the drain region, wherein it is determined whether or not data is stored in the stacked gate type memory cell in accordance with the quantity of charge stored in the floating gate electrode; and a control unit for controlling the voltage applied to at least one of the drain region and the semiconductor substrate so that data is erased by pulling out the charge stored in the floating gate electrode using a Fowler-Nordheim tunnel current, which flows from at least one of the drain region and the semiconductor substrate to the floating gate electrode, wherein said control unit determines whether or not data is erased and controls the voltage applied to at least one of the drain region and the semiconductor substrate so that the Fowler-Nordheim tunnel current increases to sufficiently pull out the charge stored in the floating gate electrode when data is not erased.

11. The memory device according to claim 10, said control unit adds a predetermined voltage to a normally applied voltage to increase the voltage applied to at least one of the drain region and the semiconductor substrate.

12. The memory device according to claim 11, said control unit increases the voltage applied to at least one of the drain region and the semiconductor substrate until data is erased completely.

13. A data erasing method in a non-volatile semiconductor memory device capable of rewriting data, wherein said non-volatile semiconductor memory device includes a split gate type memory cell having a semiconductor substrate, a floating gate electrode located over the semiconductor substrate, and a control gate electrode located over the floating gate electrode and the semiconductor substrate, the floating gate electrode storing a charge and being capacitively coupled to the control gate electrode, wherein it is determined whether or not data is stored in the split gate type memory cell in accordance with the quantity of charge stored in the floating gate electrode; said data erasing method comprising the steps of:

(a) controlling the voltage applied to the control gate electrode so that data is erased by pulling out the charge stored in the floating gate electrode using a Fowler-Nordheim tunnel current, which flows from the control gate electrode to the floating gate electrode;

(b) counting a number of data rewritings; and (c) controlling the voltage applied to the control gate electrode so that the Fowler-Nordheim tunnel current increases to sufficiently pull out the charge stored in the floating gate electrode when the number of data writings exceeds a predetermined number.

14. The data erasing method according to claim 13, wherein said (c) step includes the step of adding a predetermined voltage to a normally applied voltage to increase the voltage applied to the control gate electrode.

15. The data erasing method according to claim 14, wherein said adding step includes the step of adding the predetermined voltage to the normally applied voltage in a step-like manner each time the Fowler-Nordheim tunnel current falls and reaches a predetermined current value.

16. A data erasing method in a non-volatile semiconductor memory device capable of rewriting data, wherein said non-volatile semiconductor memory device includes a stacked gate type memory cell having a semiconductor substrate, a drain region defined on the semiconductor substrate, and a floating gate electrode located over the semiconductor substrate, the floating gate storing a charge and being capacitively coupled to the drain region, wherein it is determined whether or not data is stored in the stacked gate type memory cell in accordance with the quantity of charge stored in the floating gate electrode, said data erasing method comprising the steps of:

(a) controlling the voltage applied to at least one of the drain region and the semiconductor substrate so that data is erased by pulling out the charge stored in the floating gate electrode using a Fowler-Nordheim tunnel current, which flows from at least one of the drain region and the semiconductor substrate to the floating gate electrode;

(b) counting a number of data rewritings; and (c) controlling the voltage applied to at least one of the drain region and the semiconductor substrate so that the Fowler-Nordheim tunnel current increases to sufficiently pull out the charge stored in the floating gate electrode when the number of data writings exceeds a predetermined number.

17. The data erasing method according to claim 16, wherein said (c) step includes the step of adding a predetermined voltage to a normally applied voltage to increase the voltage applied to at least one of the drain region and the semiconductor substrate.

18. The data erasing method according to claim 17, wherein said adding step includes the step of adding the predetermined voltage to the normally applied voltage in a step-like manner each time the Fowler-Nordheim tunnel current falls and reaches to a predetermined current value.

19. A data erasing method in a non-volatile semiconductor memory device, wherein said non-volatile semiconductor memory device includes a split gate type memory cell having a semiconductor substrate, a floating gate electrode located over the semiconductor substrate, and a control gate electrode located over the floating gate electrode and the semiconductor substrate, the floating gate electrode storing a charge and being capacitively coupled to the control gate electrode, wherein it is determined whether or not data is stored in the split gate type memory cell in accordance with the quantity of charge stored in the floating gate electrode, said data erasing method comprising the steps of:

(a) controlling the voltage applied to the control gate electrode so that data is erased by pulling out the charge stored in the floating gate electrode using a Fowler-Nordheim tunnel current, which flows from the control gate electrode to the floating gate electrode;

(b) determining whether or not data is erased; and (c) controlling the voltage applied to the control gate electrode so that the Fowler-Nordheim tunnel current increases to sufficiently pull out the charge stored in the floating gate electrode when data is not erased.

20. The data erasing method according to claim 19, wherein said step (c) includes the step of adding a predetermined voltage to a normally applied voltage to increase the voltage applied to the control gate electrode.

21. The data erasing method according to claim 20 further comprising the step of (d) repeating said adding step until data is erased completely.

22. A data erasing method in a non-volatile semiconductor memory device, wherein said non-volatile semiconductor memory device includes a stacked gate type memory cell having a semiconductor substrate, a drain region defined on the semiconductor substrate, and a floating gate electrode located over the semiconductor substrate, the floating gate storing a charge and being capacitively coupled to the drain region, wherein it is determined whether or not data is stored in the stacked gate type memory cell in accordance with the quantity of charge stored in the floating gate electrode, said data erasing method comprising the steps of:

(a) controlling the voltage applied to at least one of the drain region and the semiconductor substrate so that data is erased by pulling out the charge stored in the floating gate electrode using a Fowler-Nordheim tunnel current, which flows from at least one of the drain region and the semiconductor substrate to the floating gate electrode;

(b) determining whether or not data is erased; and (c) controlling the voltage applied to at least one of the drain region and the semiconductor substrate so that the Fowler-Nordheim tunnel current increases to sufficiently pull out the charge stored in the floating gate electrode when data is not erased.

23. The data erasing method according to claim 22, wherein said (c) step includes the step of adding a predetermined voltage to a normally applied voltage to increase the voltage applied to at least one of the drain region and the semiconductor substrate.

24. The data erasing method according to claim 23 further comprising the step of (d) repeating said adding step until data is erased completely.

\* \* \* \* \*